(12) United States Patent
Raad

(10) Patent No.: US 6,477,098 B1
(45) Date of Patent: Nov. 5, 2002

(54) DYNAMIC RANDOM ACCESS MEMORY ARRAY HAVING SEGMENTED DIGIT LINES

(75) Inventor: George B. Raad, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 08/994,906

(22) Filed: Dec. 19, 1997

(51) Int. Cl.[7] .................. G11C 7/02; G11C 7/00; G11C 11/24; G11C 5/06

(52) U.S. Cl. .............. 365/207; 365/208; 365/190; 365/149; 365/63

(58) Field of Search .................. 365/207, 208, 365/190, 149, 63, 51

(56) References Cited

U.S. PATENT DOCUMENTS

| | | | | |
|---|---|---|---|---|
| 5,553,028 A | * | 9/1996 | McLaury | 365/207 |
| 5,608,668 A | * | 3/1997 | Zagar et al. | 365/149 |
| 5,726,931 A | * | 3/1998 | Zagar et al. | 365/207 |
| 5,796,666 A | * | 8/1998 | Shirley et al. | 365/207 |
| 5,856,939 A | * | 1/1999 | Seyyedy | 365/149 |
| 5,862,072 A | * | 1/1999 | Raad et al. | 365/63 |
| 5,862,089 A | * | 1/1999 | Raad et al. | 365/207 |

* cited by examiner

Primary Examiner—Trong Phan
(74) Attorney, Agent, or Firm—Seed and Berry LLP

(57) ABSTRACT

A memory-cell array includes several memory cells arranged in rows and columns. The memory cells in each row include an access terminal coupled to an associated word line. The memory cells in each column are coupled between a respective first digit line and a respective complementary digit line. The complementary digit line is divided into several portions. A sense amplifier has first and second data terminals with the first data terminal coupled to the first digit line. The memory-cell array includes several first isolation devices, each first isolation device selectively coupling an associated portion of the complementary digit line to the second data terminal of the sense amplifier.

41 Claims, 4 Drawing Sheets

DYNAMIC RANDOM ACCESS MEMORY ARRAY HAVING SEGMENTED DIGIT LINES

TECHNICAL FIELD

The present invention relates generally to dynamic random access memories, and more specifically to a dynamic random access memory array in which digit lines are segmented to thereby decrease the capacitance of such digit lines.

BACKGROUND OF THE INVENTION

In a conventional dynamic random access memory (DRAM), a memory-cell array includes a number of memory cells arranged in rows and columns. Each memory cell in a particular row has an access terminal coupled to an associated word line, and each memory cell in a particular column has a data terminal coupled to one of an associated pair of complementary digit lines. Typically, an individual memory cell includes a single storage capacitor, and data is stored in the cell in the form of charge on the storage capacitor. The DRAM further includes a number of sense amplifiers, each sense amplifier typically coupled through a pair of isolation devices to the complementary digit lines associated with a respective column of memory cells. As known in the art, the sense amplifiers operate to sense a voltage differential on the associated pair of complementary digit lines and to drive the digit lines to voltage levels corresponding to complementary logic levels in response to the sensed voltage differential. Thus, the sense amplifiers are used to sense and store data contained in addressed memory cells during a read data transfer operation.

During a read data transfer operation, all of the digit lines in the memory-cell array are biased and equilibrated, typically to a voltage equal to one-half of the supply voltage $V_{CC}$. Once the digit lines have been biased and equilibrated, a row address is decoded and the word line corresponding to the decoded row address is activated. In response to the activated word line, each memory cell coupled to that word line transfers the charge stored on the associated storage capacitor to the associated one of the pair of complementary digit lines. This transfer of charge results in the voltage on the digit line either slightly increasing or slightly decreasing relative to the biased and equilibrated voltage of $V_{CC}/2$. As a result, one digit line in each pair of complementary digit lines now has a voltage equal to $V_{CC}/2$ while the other digit line in the pair has a voltage slightly less than or greater than this value. The sense amplifier coupled to each complementary pair of digit lines senses this voltage differential and drives the digit line having the lesser voltage to ground and the digit line having the greater voltage to approximately the supply voltage. In this way, the sense amplifiers operate to sense the data stored in each memory cell in an activated row in the memory-cell array.

The voltage differential that must be sensed by each sense amplifier is typically very small, on the order of several hundred millivolts. In order to reliably sense such a small voltage differential, the components of the sense amplifier must be formed according to precise manufacturing tolerances, which increases the cost of fabricating the DRAM. The reason the voltage differential is so small is that the capacitance of each digit line is much greater than the capacitance of the storage capacitor of each memory cell. As a result, the charge transferred from the storage capacitor in the memory cell to the digit line does not result in a significant increase or decrease in the voltage of the digit line. One way to increase the voltage differential between the complementary pair of digit lines is to increase the value of the storage capacitor in the memory cell, or, conversely, to decrease the capacitance of the digit lines. Both alternatives, however, are difficult to implement. The capacitance of the storage capacitor in each memory cell, if increased, results in a larger memory cell resulting in fewer memory cells fabricated on the same size semiconductor substrate. Similarly, the digit lines must be formed in the semiconductor substrate having particular dimensions to satisfy particular design criteria, and variations in the layout and dimensions of the digit lines to decrease the capacitance of the digit lines may be contrary to the required design criteria.

There is a need for a DRAM capable of providing an increased voltage differential on digit lines in response to activated memory cells in a memory-cell array.

SUMMARY OF THE INVENTION

A dynamic random access memory device includes dynamic cell plate sensing of data stored in memory cells in the memory device. The memory device comprises a number of first and second digit line portions, each of which is formed from a first conductive layer on a substrate. The memory device also includes a number of strap portions, each of which is formed from a second conductive layer on the substrate. A number of cell plates are formed from a third conductive layer on the substrate, each of which receives a reference voltage. A number of memory cells are arranged in rows and columns. Each memory cell in a row includes an access terminal coupled to an associated word line. Each memory cell in a column has a data terminal coupled to one of the first and second digit line portions associated with the column.

A number of sense amplifiers are contained in the memory device, each of which is associated with a column of memory cells. Each sense amplifier has first and second data terminals. Each sense amplifier is operable to sense a voltage differential between the data terminals and drive the data terminals to voltage levels corresponding to complementary logic levels in response to the sensed voltage differential. A number of first isolation devices, each having a control terminal coupled to receive a first control signal, a first signal terminal coupled to the first terminal of an associated sense amplifier, and a second signal terminal coupled to an associated first digit line portion, are each operable to couple the first signal terminal to the second signal terminal in response to the first control signal. A number of second isolation devices, each having a control terminal coupled to receive a second control signal, a first signal terminal coupled to the first terminal of an associated sense amplifier, and a second signal terminal coupled through an associated strap portion to an associated second digit line portion, are each operable to couple the first signal terminal to the second signal terminal in response to the second control signal. A number of third isolation devices, each having a control terminal coupled to receive a third control signal, and first and second signal terminals coupled between the at least one cell plate and the second terminal of an associated sense amplifier, are each operable to couple the first signal terminal to the second signal terminal in response to the third control signal.

DETAILED DESCRIPTION OF THE INVENTION

Figure 1:
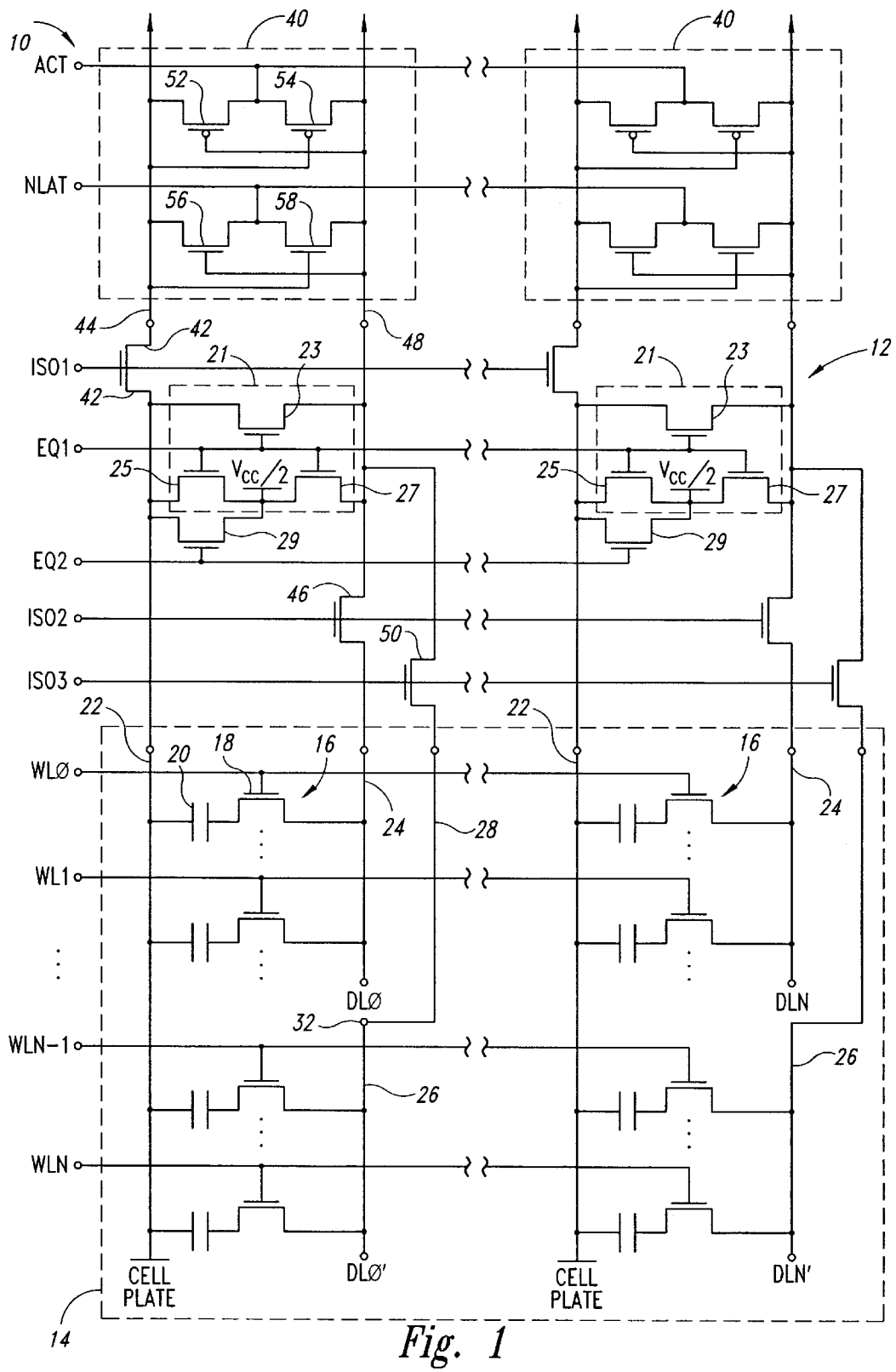
FIG. 1 is a schematic diagram of an isolation circuit and memory-cell array for a DRAM according to a first embodiment of the present invention.

FIG. 1 is a portion of a DRAM 10 including an isolation circuit 12 and memory-cell array 14 formed according to a first embodiment of the present invention. The memory-cell array 14 includes a number of memory cells 16 arranged in rows and columns. Each memory cell 16 includes an NMOS access transistor 18 and a storage capacitor 20, and is operable to store a binary bit of data in the form of a charge on the storage capacitor 20. Each capacitor 20 has one terminal connected to an associated cell plate line 22 which is coupled to receive a reference voltage, typically a supply voltage $V_{CC}$ divided by two. The cell plate line 22 may be considered as a first digit line. The other terminal of each storage capacitor 20 in a column of memory cells 16 is coupled through the associated access transistor 18 to one of two digit line portions associated with each column of memory cells. In each column of memory cells 16, a first digit line portion 24 is coupled to a number of the memory cells 16 in that column, and a second digit line portion 26 is coupled to the remainder of the memory cells 16 in the column. In column 0, the first digit line portion 24 is designated DL0 and the second digit line portion 26 is designated DL0', and likewise for column N the first digit line portion 24 is designated DLN while the second digit line portion 26 is designated DLN'. Each second digit line portion 26 is coupled to one end of a strap portion 28 extending parallel to the first digit line portion 24. Typically, the first and second digit line portions 24 and 26 are formed from a first polysilicon layer on a semiconductor substrate on which the DRAM 10 is formed, and the strap portion 28 is formed from a metal layer on the substrate.

In operation, when the word line WL for a particular row is activated, each memory cell 16 coupled to that word line transfers the charge stored on the associated storage capacitor 20 to one of the first and second digit line portions 24 and 26. For example, when the word line WL0 associated with the first row of memory cells is activated, each memory cell 16 in that row transfers the charge stored on the associated storage capacitor 20 to the associated first digit line portion 24. In contrast, if the word line WLN associated with the Nth row of memory cells is activated, each memory cell 16 in that row couples the charge stored on its associated storage capacitor 20 to the associated second digit line portion 26.

The cell plate line 22, first digit line portion 24, and strap portion 28 associated with each column of memory cells in the memory-cell array 14 are coupled through the isolation circuit 12 to an associated sense amplifier 40. More specifically, each cell plate line 22 is coupled through an isolation transistor 42 to a first data terminal 44 of the sense amplifier 40, each first digit line portion 24 is coupled through an isolation transistor 46 to a second data terminal 48 of the sense amplifier 40, and each strap portion 28 is coupled through an isolation transistor 50 to the second data terminal 48 of the sense amplifier 40. Each sense amplifier 40 operates in a conventional manner to sense a voltage differential between the first and second data terminals 44 and 48 and to drive the data terminals to voltage levels corresponding to complementary logic levels in response to the sensed voltage differential.

Each sense amplifier 40 includes a pair of PMOS transistors 52 and 54 having their source and drain terminals coupled in series between the first and second data terminals 44 and 48. The gate terminals of the transistors 52 and 54 are coupled to the second and first data terminals 44 and 48, respectively, and the interconnected source terminals of the transistors 52 and 54 are coupled to receive an active pull-up signal ACT which, when activated, goes high to provide the supply voltage $V_{CC}$ to the source terminals of the transistors 52 and 54. In operation, the transistors 52 and 54 drive the data terminal 44 or 48 having the higher voltage to the supply voltage $V_{CC}$. The sense amplifier 40 further includes a pair of series connected NMOS transistors 56 and 58 having their source and drain terminals connected in series between the first and second data terminals 44 and 48. The gate terminals of the transistors 56 and 58 are connected to the second and first data terminals 44 and 48, respectively, and the interconnected source terminals of the transistors 56 and 58 are coupled to receive a latch signal NLAT which, when activated, drives the source terminals of the transistors 56 and 58 to ground. The transistors 56 and 58 operate to drive the data terminal 44 or 48 at the lower voltage to ground. Although the sense amplifier 40 is described as including the transistors 52–58, other circuit configurations may also be utilized as understood by one skilled in the art.

The DRAM 10 further includes a conventional bias and equilibration circuit 21 receiving a first equilibration signal EQ1 and including the NMOS transistors 23, 25, and 27 coupled as shown between cell plate line 22 and the data terminal 48. In operation, the signal EQ1 is activated when the signals ISO2 and ISO3 are activated to bias and equilibrate the cell plate line 22 and digit line portions 24 and 26 to $V_{CC}/2$. In addition, a bias transistor 29 receives a second equilibration signal EQ2 and operates, when activated, to drive the cell plate line 22 to the bias voltage $V_{CC}/2$. The operation of the bias and equilibration circuit 21 and bias transistor 29 during data transfer operations of the DRAM 10 will be described in more detail below.

The overall operation of the isolation circuit 12, memory-cell array 14, and sense amplifiers 40 during a read data transfer operation of the DRAM 10 will now be described. During operation of the DRAM 10 during a read operation, a control circuit (not shown in FIG. 1) develops the signals ISO1–ISO3, EQ1, EQ2, ACT, and NLAT in response to various control signals supplied to the DRAM 10. Before a read data transfer operation, the control circuit activates the signal EQ1 for a predetermined time to bias and equilibrate the first and second digit line portions 24 and 26 and the cell plate line 22 in each column of memory cells 16 to the bias voltage of approximately $V_{CC}/2$, and to likewise bias the data terminals 44 and 48 of each sense amplifier 40 at the voltage $V_{CC}/2$. A row decode circuit (not shown in FIG. 1) receives and decodes a row address and activates the word line WL corresponding to the decoded row address. When the word line WL corresponding to the decoded row address is activated, each memory cell 16 coupled to that word line transfers charge from the associated storage capacitor 20 to either the first digit line portion 24 or the second digit line portion 26 coupled to the activated memory cell.

Once the row address has been decoded, but just before the appropriate word line WL is activated, the control circuit drives the isolation signal ISO1, and one of the isolation signals ISO2 and ISO3 high coupling the cell plate line 22 to the first data terminal 44 and one of the first and second digit line portions 24 and 26 to the second data terminal 48. Only one of the isolation devices 46 and 50 is activated so that only one of the first digit line portion 24 and second digit line portion 26 is coupled to the second data terminal 48. The control circuit determines which isolation signal ISO2 or ISO3 to activate by detecting which word line WL is to be activated. For example, if the row decode circuitry decodes the row address and activates the word line WL0, the control circuit activates the isolation signal ISO2 so that the first digit line portion 24 coupled to the memory cell 16 associated with the word line WL0 is thereby coupled to the second data terminal 48. In contrast, if the row decode circuitry activates the word line WLN, the control circuit activates the isolation signal ISO3 so that the second digit line portion 26 is coupled through the strap portion 28 and through the transistor 50 to the second data terminal 48.

After the isolation signal ISO1 and the appropriate one of the isolation signals ISO2 or ISO3 has been activated, the appropriate word line WL is activated, causing a voltage differential to develop across the first and second data terminals 44 and 48 corresponding to the data stored in the memory cell 16 coupled to the activated word line WL. For example, assume that each memory cell 16 coupled to the word line WL0 has stored a binary 1 so that each associated storage capacitor 20 has a voltage of approximately $V_{CC}$ on its plate coupled to the access transistor 18. When the word line WL0 is activated, the transistor 18 turns ON transferring the charge stored on the capacitor 20 to the associated first digit line portion 24. In response to this transfer of charge to the first digit line portion 24, the voltage on the first digit line portion 24 increases slightly above the bias voltage of $V_{CC}/2$ to which the first digit line portion 24 was equilibrated. This slightly higher voltage on the first digit line portion 24 is coupled through the activated isolation transistor 46 to the second data terminal 48, which now has a voltage slightly higher than the bias voltage of approximately $V_{CC}/2$. At the same time, the voltage on the cell plate line decreases slightly below the voltage $V_{CC}/2$, and this voltage is coupled through the activated isolation transistor 42 to the first data terminal 44.

At this point, the voltages on the first and second data terminals 44 and 48 are slightly lower and higher, respectively, than the bias voltage $V_{CC}/2$. The control circuit then deactivates the signals ISO1 and ISO2 to turn OFF the isolation transistors 42 and 46 and isolate the data terminals 44 and 48 from the lines 22 and 24, respectively. After deactivating the signals ISO1 and ISO2, the control circuit activates the equilibration signal EQ2 to restore the cell plate line 22 to the bias voltage $V_{CC}/2$. At this point, the voltage differential across the data terminals 44 and 48 remains, and the control circuit thereafter activates the latch signal NLAT, and then the pull-up signal ACT by driving the signals low and high, respectively. When the latch signal NLAT goes low, the transistor 56 turns ON harder than the transistor 58 due to the slightly higher voltage present on the second data terminal 48. As a result, the transistor 56 drives the first data terminal 44 to ground through the transistor 56 while the transistor 58 turns OFF. In response to the signal ACT going high, the transistor 54 turns ON, driving the second data terminal 48 high while the transistor 52 turns OFF. By turning OFF the isolation transistors 42 and 46, the sense amplifier 40 need only drive the capacitance associated with data terminals 44 and 48 and not the capacitances of the cell plate line 22 and first digit line portion 24. In addition, the cell plate line 22 cannot be driven too far from its bias voltage $V_{CC}/2$ as it would be if the isolation transistor 42 was not turned OFF. The voltage on the cell plate line 22 must be maintained at $V_{CC}/2$ to ensure proper data storage by each storage capacitor 20 coupled to the cell plate line 22.

Once each sense amplifier 40 has sensed the logic "1" level stored in the associated memory cell 16 coupled to the word line WL0 by driving the first and second data terminals 44 and 48 low and high, respectively, the control circuit once again activates the isolation signal ISO2, turning ON the transistor 46 and thereby coupling the second data terminal 48 to the first digit line portion 24. The second isolation signal ISO2 is once again activated to restore the data in the activated memory cells 16. In other words, after the sense amplifier 40 has driven the second data terminal 48 high, corresponding to the logic "1" stored in each memory cell 16 coupled to the word line WL0, the second data terminal 48 is once again coupled to the first digit line portion 24 to thereby restore the charge on the storage capacitors 20 corresponding to the logic "1." The control circuit thereafter transfers the sensed data stored in the sense amplifier 40 corresponding to the column of the addressed memory cell 16 onto a data bus of the DRAM 10 where the data is available to be read by an external circuit such as a processor. Notice that the control circuit does not once again activate the isolation signal ISO1 because, as previously discussed, the cell plate line 22 must be isolated from the data terminal 44 after the sense amplifier 40 has driven that terminal either low or high.

In an alternative embodiment, the isolation signal ISO1 and associated transistor 42 are eliminated and the data terminal 44 coupled directly to the cell plate line 22. One skilled in the art will realize that in this alternative embodiment the sense amplifier 40 no longer drives the data terminal 44 to a voltage corresponding to a complementary logic level. Instead, the sense amplifier 40 merely uses the voltage on the cell plate line 22 as a reference voltage and drives the data terminal 48 to a voltage corresponding to the data stored in the accessed memory cell 16.

The technique of coupling the cell plate line 22 to the first data terminal 44 of the sense amplifier 40 is known as "dynamic cell plate sensing." In the dynamic cell plate sensing scheme illustrated in FIG. 1, the digit line associated with a column of memory cells 16 is split into the first and second digit line portions 24 and 26, respectively, which results in faster and more reliable sensing by each sense amplifier 40 due to the increased voltage differential between the data terminals 44 and 48 resulting from the reduced capacitance of the first and second digit line portions 24 and 26. The voltage differential increases because the charge stored in each capacitor 20 is shared with a smaller capacitor in the form of the associated first or second digit line portion 24 or 26. As a result of the smaller capacitance of the portions 24 and 26, the voltage on these portions changes by a greater amount in response to the shared charge from the associated storage capacitor 20. The reduced capacitance of the portions 24 and 26 also allows the voltage coupled to the data terminals 44 and 48 to change at a faster rate. If the capacitance of each of the first and second digit line portions 24 and 26 is approximately one-half that of a full length digit line, the resultant voltage differential between the terminals 44 and 48 will nearly double, as will the rate at which the voltage differential between these terminals can change. The capacitance of a digit line is proportional to the length of the digit line, and thus each portion 24 and 26 is typically about half the length of a full length digit line in a similar conventional memory-cell array. It should be noted that the strap portion 28 will add some capacitance to the second digit line portion 26, and thus the first and second digit line portions 24 and 26 may not be exactly half the length of a conventional digit line. Of course, it will be understood that the digit lines can be divided into more than two portions to further reduce the effective capacitance of the digit lines.

The embodiment of FIG. 1 allows the split bit line isolation scheme to be formed utilizing existing layers available in conventional DRAM layouts. For example, in a conventional DRAM memory-cell array, a pair of complementary digit lines is associated with each column of memory cells. One of these complementary digit lines may be formed from a first polysilicon layer formed on a semiconductor substrate while the second digit line may be formed from a first metal layer formed on the substrate. In the conventional DRAM layout, the cell plate is formed from another polysilicon layer on the substrate. Thus, when utilizing the dynamic cell plate sensing scheme illustrated in FIG. 1, the polysilicon layer corresponding to the cell plate line 22 is already available as is the polysilicon layer for the first and second digit line portions 24 and 26. With this configuration, the metal layer formerly used in forming one of the complementary digit lines is no longer needed and is thus available for utilization as the strap portion 28 to thereby enable splitting of the digit line into the first and second digit line portions 24 and 30 as illustrated.

Figure 2:
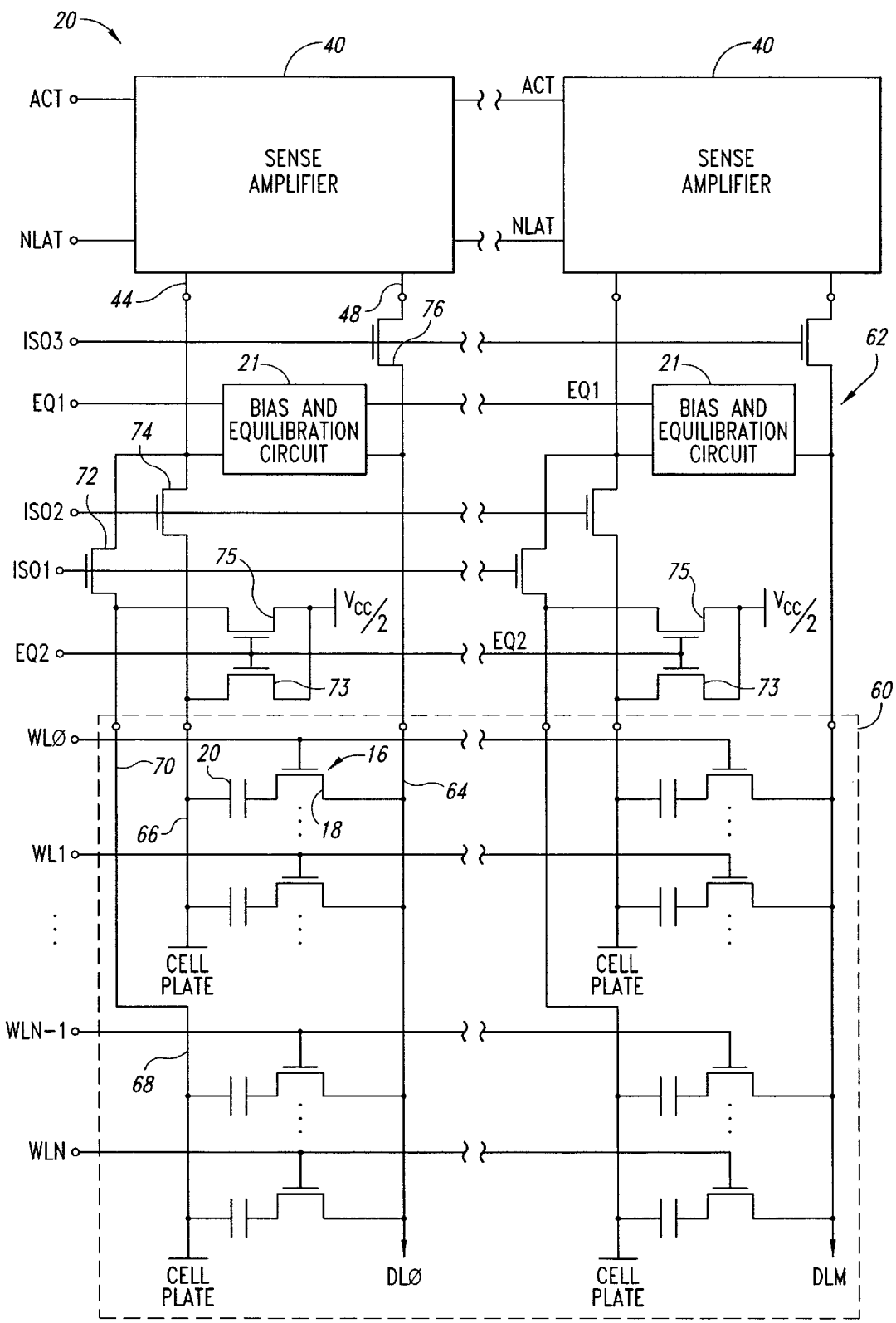
FIG. 2 is a schematic diagram of an isolation circuit and memory-cell array for a DRAM according to a second embodiment of the present invention.

A portion of a DRAM 20 formed according to a second embodiment of the present invention is illustrated in FIG. 2. Components of the DRAM 20 which are the same as those of the DRAM 10 described with reference to FIG. 1 have been given the same reference numerals, and for the sake of brevity will not be described in further detail. The DRAM 20 includes a memory-cell array 60 coupled to the sense amplifiers 40 through an isolation circuit 62. The memory-cell array 60 includes N rows and M columns of memory cells 16. Each column of memory cells 16 has an associated digit line 64, two of which are shown for the columns 0 and M. The digit line 64 is coupled to the drain terminal of the access transistor 18 of each memory cell 16 contained in a particular column of memory cells.

In contrast to the memory-cell array 14 of FIG. 1, each storage capacitor 20 associated with a particular column of memory cells is not coupled to a single cell plate line. Instead, a number of the memory cells 16 in a particular column have their associated storage capacitors 20 coupled to a first cell plate line 66 while the remainder of the storage capacitors 20 in that column of memory cells are coupled to a second cell plate line 68. The second cell plate line 68 is coupled to the data terminal 44 of the sense amplifier 40 through a strap portion 70 and an isolation transistor 72 while the first cell plate line 66 is coupled to the data terminal 44 through an isolation device 74. The digit line 64 associated with each column of memory cells 16 is coupled to the data terminal 48 of the associated sense amplifier 40 through an associated isolation transistor 76. The isolation transistors 72, 74 and 76 have their gate terminals coupled to receive the isolation signals ISO1, ISO2, and ISO3, respectively. The DRAM 20 further includes two bias transistors 73 and 75 receiving the equilibration signal EQ2 and coupled between the bias voltage $V_{cc}/2$ and the cell plate lines 66 and 68, respectively.

In operation, before a read data transfer operation, a control circuit (not shown in FIG. 2) activates the equilibration signal EQ1 for a predetermined time to equilibrate the digit lines 64 to a voltage of approximately $V_{CC}/2$. A row decode circuit (not shown in FIG. 2) thereafter decodes a row address supplied to the DRAM 20 and activates a word line WL corresponding to the decoded row address. In response to the activated word line WL, each memory cell 16 coupled to that word line transfers the charge stored on the associated storage capacitor 20 to the associated digit line 64. After the row decode circuit has decoded the row address, but before the word line WL is activated, the control circuit activates the isolation signal ISO3 and one of the isolation signals ISO1 and ISO2. In the same way as described with reference to FIG. 1, the control circuit determines which signal ISO1 or ISO2 to activate based upon which word line WL is to be activated. For example, if the word line WL0 is activated, the isolation signal ISO2 is activated, thereby coupling the first cell plate line 66 to the data terminal 44 through the isolation transistor 74. Alternatively, if the word line WLN is activated, the control circuit activates the isolation signal ISO1 thereby coupling the second cell plate line 68 through the strap portion 70 and through the isolation transistor 72 to the data terminal 44.

The row decoder thereafter activates the word line WL, and after a voltage differential develops between terminal 44 and 48, the control circuit deactivates the isolation signal ISO3 and the activated one of the isolation signals ISO1 and ISO2. The control circuit then sequentially activates the signals EQ2, NLAT, and ACT as previously described, and the sense amplifier 40 begins driving the data terminals 44 and 48 to complementary logic levels corresponding to the data stored in the activated memory cell 16. After the sense amplifier 40 has driven the data terminals 44 and 48 to voltages corresponding to the data stored in the activated memory cells 16, the control circuit once again activates the isolation signal ISO3 coupling the data terminal 48 to the associated digit line 64 and thereby restoring the sensed data in the activated memory cells 16.

In the embodiment of FIG. 2, operation of the sense amplifiers 40 is improved by splitting the cell plate line associated with a column of memory cells 16 into the first and second cell plate lines 66 and 68. The reduced capacitance of each of the split cell plate lines 66 and 68 results in a larger voltage differential across the data terminals 44 and 48 of the sense amplifiers 40. Thus, the sense amplifiers 40 more quickly and reliably sense the data stored in the activated memory cells 16. The dependence of the differential voltage developed across the data terminals 44 and 48 on the capacitances of the digit line 64 and the cell plate lines 66 and 68 is given by the following equation:

$$\Delta V = \frac{C_C \cdot V_{CC}/2}{\left(\frac{C_P C_D}{C_P + C_D}\right) + C_C}$$

where $C_C$ is the capacitance of the storage capacitor 20, $C_D$ is the capacitance of the digit line 64, $C_P$ is the capacitance of each of the cell plate lines 66 and 68, and $\Delta V$ is the change in voltage on the digit line 64 due to the transfer of charge from the storage capacitor 20 in the activated memory cell 16. As seen from this equation, as the capacitance $C_P$ of the cell plate lines 66 and 68 is decreased, the differential voltage $\Delta V$ increases.

Although the embodiments of FIGS. 1 and 2 include dynamic cell plate sensing, one skilled in the art will realize the present invention is not limited to memory-cell arrays utilizing dynamic cell plate sensing. For example, in a memory-cell array including a pair of complementary digit lines associated with each column of memory cells, one or both of the complementary digit lines can be segmented into two or more digit line portions. Each digit line portion is then coupled through an associated isolation device to a data terminal of a respective sense amplifier. Moreover, although the isolation devices are shown adjacent the sense amplifiers in the embodiments of FIGS. 1 and 2, one skilled in the art will realize the isolation devices may be positioned elsewhere in the memory-cell array, such as adjacent the digit line portion to which the device is electrically connected.

Figure 3:
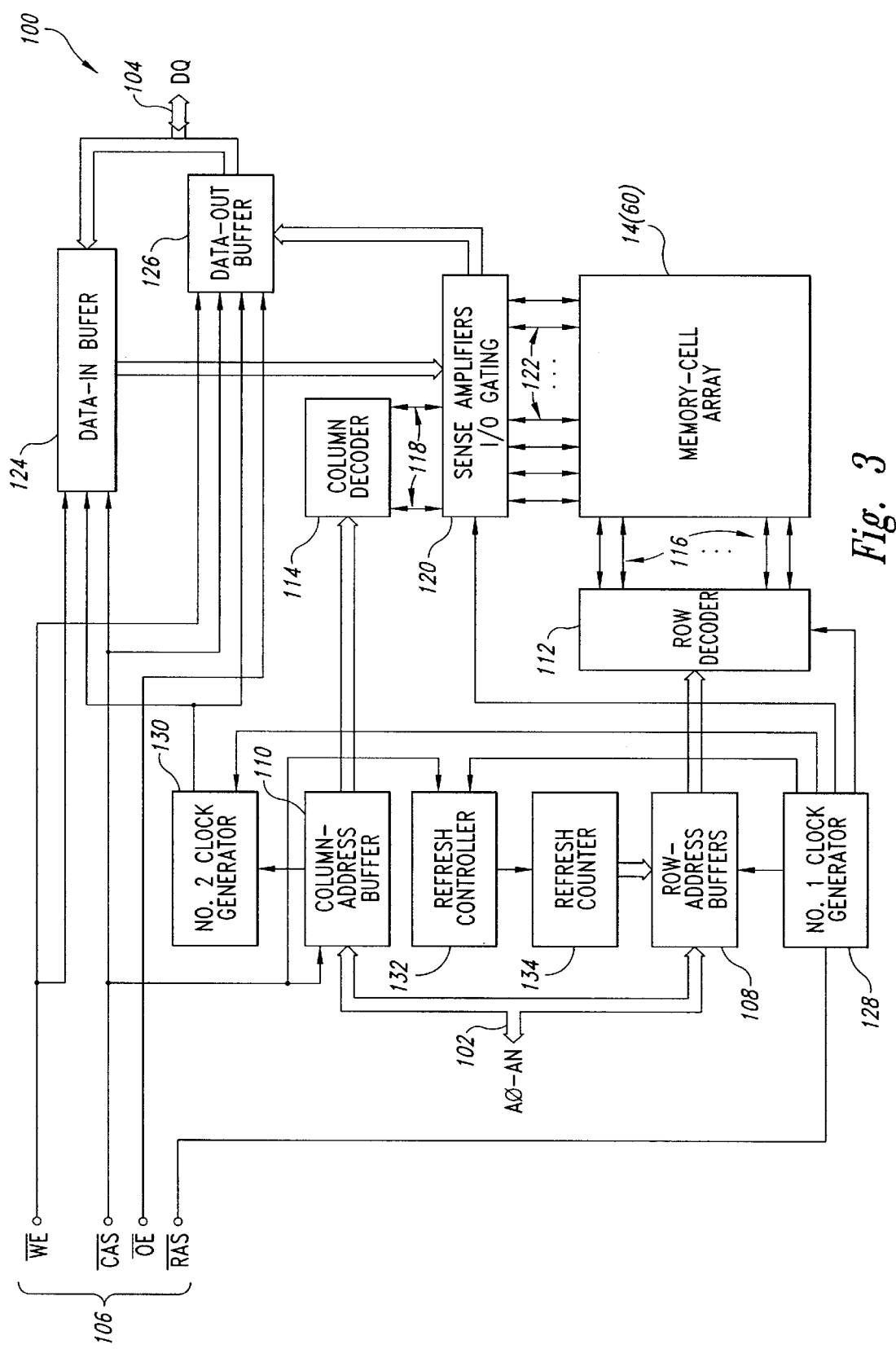
FIG. 3 is a block diagram of a dynamic random access memory including the isolation circuit and memory-cell array of FIG. 1.

FIG. 3 is a block diagram of a DRAM 100 including the memory-cell array 14, or the memory-cell array 60, previously described with reference to FIGS. 1 and 2, respectively. The DRAM 100 includes an address bus 102, data bus 104, and control bus 106 operable to carry address, data, and control information, respectively, to and from the DRAM 100. The address bus 102 is coupled to a row address buffer 108 and column address buffer 110 operable to latch row and column addresses, respectively, applied on the address bus 102. The row and column address buffers 108 and 110 output the respective row and column addresses to a row decoder 112 and column decoder 114 which operate to decode the row and column addresses, respectively. In response to the decoded row address, the row decoder 112 activates one of a number of word lines 116 corresponding to the decoded row address, and the column decoder 114 activates one of a number of column select signals 118 corresponding to the decoded column address. A sense amplifier and I/O gating circuit 120 is coupled to receive the column select signal 118 from the column decoder 114, and is further coupled to a number of digit lines 122 of the memory-cell array 14. In response to the column select signal 118, the sense amplifier and I/O gating circuit 120 couples the digit line 122 corresponding to the activated column select signal 118 to the data bus 104 through a data input buffer 124 during a write data transfer operation, and through a data output buffer 126 during a read data transfer operation.

The control of the various components of the DRAM 100 during read and write data transfer operations is performed in response to a write enable signal $\overline{WE}$, an output enable signal $\overline{OE}$, a row address strobe signal $\overline{RAS}$, and a column address strobe signal $\overline{CAS}$ provided on the control bus 106. These control signals, along with internal control signals developed by a first clock generator circuit 128 and a second clock generator circuit 130, control operation of the DRAM 100 during data transfer operations. The DRAM 100 further includes a refresh controller 132 operable to control a refresh counter 134 during refresh of the data stored in the memory cells of the memory-cell array 14 as known in the art.

In operation, external circuitry such as a processor provides address, control, and data signals on the respective buses 102, 104, and 106 to control operation of the DRAM 100. During a read data transfer operation, the external circuit drives the write enable signal $\overline{WE}$ high and the output enable signal $\overline{OE}$ low, placing the data input buffer 124 in a high impedance state and placing the data output buffer 126 in a low impedance state which couples the data bus 104 through the data output buffer 126 to the sense amplifier and I/O gating circuit 120. The external circuit then provides a row address on the address bus 102 and drives the row address strobe signal $\overline{RAS}$ low causing the row address buffer 108 to latch the row address under control of the first clock generator circuit 128. The row address buffer 108 outputs the latched row address to the row decoder circuit 112 which decodes the latched row address and activates the word line 116 corresponding to the decoded row address.

While the row address is propagating through the row decoder 112, the external circuit applies a column address on the address bus 102 and drives the column address strobe signal $\overline{CAS}$ low thereby latching the column address in the column address buffer 110. The column address buffer 110 outputs the latched column address to the column decoder circuit 114 which decodes the latched column address and activates the column select signal 118 corresponding to the decoded column address. While the column address was being latched and decoded, the word line corresponding to the decoded row address from the row decoder 112 has been activated and the sense amplifiers in the sense amplifier and I/O gating circuit 120 have sensed and stored the data contained in each memory cell in the memory-cell array 14 coupled to the activated word line 116. The sense amplifier and I/O gating circuit 120 includes the isolation circuit 12 illustrated in FIG. 1, and the isolation circuit is controlled by the clock generator circuit 128 during sensing of the stored data as previously described with reference to FIG. 1. After the sense amplifiers in the sense amplifier and I/O gating circuit 120 have sensed and stored the addressed data, and after the column address has been decoded and the column select signal 118 corresponding to the decoded column address activated, the data stored in the addressed memory cell is output from the sense amplifier and I/O gating circuit 120 through the data output buffer 126 and onto the data bus 104 where it is available to be read by the external circuit.

During a write data transfer operation, the external circuit drives the output enable signal $\overline{OE}$ high placing the data output buffer 126 in a high impedance state, and drives the write enable signal $\overline{WE}$ low placing the data input buffer 124 in a low impedance state and thereby coupling the data bus 104 through the data input buffer 124 to the sense amplifier and I/O gating circuit 120. The external circuit then applies a row address on the address bus 102 and this applied row address is strobed, latched, and decoded as previously described for a read data transfer operation. The external circuit then applies a column address on the address bus 102 and this column address is likewise strobed, latched, and decoded as previously described. The external circuit then applies the data to be written to the addressed memory cell on the data bus 104, and this data is transferred through the data input buffer 124 to the sense amplifier and I/O gating circuit 120. Once the row and column addresses corresponding to the addressed memory cell have been decoded, the sense amplifier and I/O gating circuit 120 transfers the data to be written to the addressed memory cell onto the digit line 122 corresponding to the addressed memory cell to thereby transfer the data into the addressed memory cell. The activated word line 116 is thereafter deactivated storing the written data in the addressed memory cell.

Figure 4:
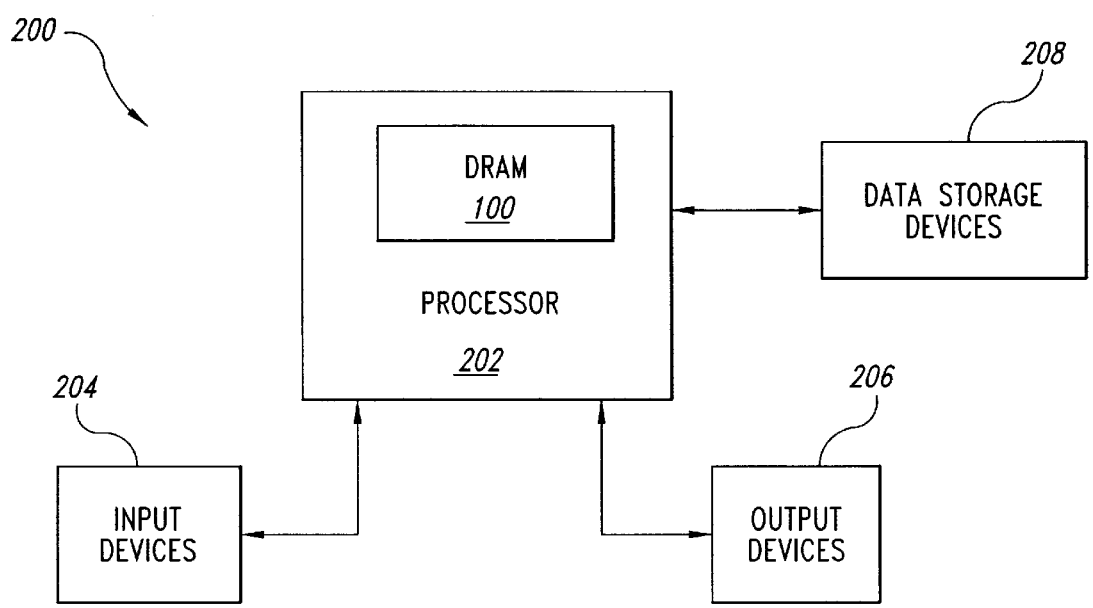
FIG. 4 is a block diagram of a computer system including the dynamic random access memory of FIG. 3.

FIG. 4 is a block diagram of a computer system 200 which uses the DRAM 100 of FIG. 3. The computer system 200 includes a processor 202 for performing various computing functions, such as executing specific software to perform specific calculations or tasks. In addition, the computer system 200 includes one or more input devices 204, such as a keyboard or a mouse, coupled to the processor 202 to allow an operator to interface with the computer system. Typically, the computer system 200 also includes one or more output devices 206 coupled to the processor 202, such output devices typically being a printer or a video terminal. One or more data storage devices 208 are also typically coupled to the processor 202 to store data or retrieve data from the external storage media (not shown). Examples of typical storage devices 208 include hard and floppy disks, tape cassettes, and compact disk read-only memories (CD-ROMs). The processor 202 is typically coupled to the DRAM 100 through a control bus, a data bus, and an address bus to provide for writing data to and reading data from the DRAM.

It is to be understood that even though various embodiments and advantages of the present invention have been set forth in the foregoing description, the above disclosure is illustrative only and changes may be made in detail, and yet remain within the broad principles of the invention. Therefore, the present invention is to be limited only by the appended claims.

What is claimed is:

1. A memory-cell array, comprising:
    several memory cells arranged in rows and columns, the memory cells in each row including an access terminal coupled to an associated word line, and the memory cells in each column being coupled between a respective first digit line and a respective second digit line, the second digit line being divided into several portions;
    a sense amplifier having first and second data terminals, the first data terminal being coupled to the first digit line;
    several first isolation devices, each first isolation device selectively coupling an associated portion of the second digit line to the second data terminal of the sense amplifier.

2. The memory-cell array of claim 1 wherein the second digit line is divided into first and second portions.

3. The memory-cell array of claim 1, further comprising several straps, each strap coupling an associated portion of the second digit line to an associated strap terminal positioned proximate the sense amplifier, and wherein each first isolation device is coupled between the second data terminal of the sense amplifier and the associated strap terminal.

4. The memory-cell array of claim 1, further comprising a third isolation device selectively coupling the first digit line to the first data terminal of the sense amplifier.

5. The memory-cell array of claim 1 wherein each of the isolation devices is a transistor.

6. A memory-cell array, comprising:
    several memory cells arranged in rows and columns, the memory cells in each row including an access terminal coupled to an associated word line, and the memory cells in each column being coupled between a respective first digit line and a respective second digit line, the second digit line being divided into first and second portions;
    a sense amplifier having first and second data terminals, the first data terminal being coupled to the first digit line;
    a first isolation device selectively coupling the first portion of the second digit line to the second data terminal of the sense amplifier; and
    a second isolation device selectively coupling the second portion of the second digit line to the second data terminal of the sense amplifier.

7. The memory-cell array of claim 6, further comprising a strap coupling the second portion of the complementary digit line to a strap terminal positioned proximate the sense amplifier, and wherein the second isolation device is coupled between the strap terminal and the second data terminal of the sense amplifier.

8. The memory-cell array of claim 6, further comprising a third isolation device selectively coupling the first digit line to the first data terminal of the sense amplifier.

9. The memory-cell array of claim 6 wherein each of the isolation devices is a transistor.

10. A memory-cell array, comprising:
    a plurality of memory cells arranged in rows and columns;
    a plurality of first line portions, each column of memory cells including several first line portions with each memory cell in a respective column coupled to one of the first line portions associated with the column;
    a plurality of second line portions, each second line portion coupled to the memory cells in a respective column;
    a plurality of sense amplifiers with each sense amplifier being associated with a respective column of memory cells, each sense amplifier having a first data terminal coupled to the associated second line portion and having a second data terminal; and
    a plurality of isolation devices, each column of memory cells having several associated isolation devices, each isolation device in a respective column having a control terminal coupled to receive a respective control signal, a first signal terminal coupled to one of the several first line portions associated with the column, and a second signal terminal coupled to the first data terminal of the sense amplifier associated with the column, each isolation device coupling its first signal terminal to its second signal terminal in response to the associated control signal.

11. The memory-cell array of claim 10, further including several additional isolation devices, each additional isolation device having a control terminal coupled to receive a control signal, and first and second signal terminals coupled in series between the first data terminal of a respective sense amplifier and the associated second line portion, each additional isolation device operable to couple the first signal terminal to the second signal terminal in response to the control signal.

12. The memory-cell array of claim 10 wherein the first line portions are digit lines.

13. The memory-cell array of claim 10 wherein each of the second line portions is a digit line.

14. The memory-cell array of claim 10 wherein each of the second line portions is a cell plate coupled to a reference voltage.

15. The memory-cell array of claim 14 wherein the reference voltage is equal to one half of a supply voltage $V_{CC}$.

16. The memory-cell array of claim 10 wherein each of the isolation devices is a transistor.

17. The memory-cell array of claim 10 wherein each sense amplifier comprises:
    a first sense switch having a control terminal coupled to the second data terminal, a first signal terminal coupled to a common reference voltage level, and a second signal terminal coupled to the first data terminal;
    a second sense switch having a control terminal coupled to the first data terminal, a first signal terminal coupled to the common reference voltage level, and a second signal terminal coupled to the data terminal;
    a third sense switch having a control terminal coupled to the second data terminal, a first signal terminal coupled to a supply voltage Vcc, and a second signal terminal coupled to the first data terminal; and
    a fourth sense switch having a control terminal coupled to the first data terminal, a first signal terminal coupled to the supply voltage Vcc, and a second signal terminal coupled to the second data terminal.

18. A memory-cell array, comprising:
    a plurality of memory cells arranged in rows and columns, each memory cell including an access terminal coupled to a word line associated with each row of memory cells, a data terminal, and a reference terminal;
    a plurality of sense amplifiers with each sense amplifier being associated with a respective column of memory cells, each sense amplifier having first and second data terminals, the sense amplifier being operable to sense a voltage differential between the first and second data terminals and drive the data terminals to voltage levels corresponding to complementary logic levels in response to the sensed voltage differential;

a plurality of digit line portions, each column of memory cells including several digit line portions, each digit line portion positioned adjacent a plurality of memory cells in the column and the data terminal of each memory cell in a respective column coupled to the adjacent one of the digit line portions;

a plurality of strap portions, each column of memory cells including several strap portions, each strap portion having an end adjacent one of the digit line portions in the column and an end adjacent the sense amplifier associated with the column;

a plurality of cell plate lines, each column of memory cells including at least one cell plate line coupled to receive a reference voltage, each cell plate line positioned adjacent a number of memory cells in the column, and the reference terminal of each memory cell in a respective column coupled to the adjacent one of the cell plate lines; and a plurality of isolation devices, each column of memory cells having several first and second associated isolation devices, each first isolation device in a respective column coupled to receive a respective control signal and operable, in response to the control signal, to couple one of the digit line portions through the adjacent strap portion to the second data terminal of the associated sense amplifier, and each second isolation device associated with a respective column coupled to receive a respective control signal and operable, in response to the control signal, to couple one of the cell plate lines to the first data terminal of the associated sense amplifier.

19. The memory-cell array of claim 18 wherein each of the first isolation devices associated with a respective column is positioned adjacent the sense amplifier associated with the column, and is coupled between the second data terminal and the end of the strap portion adjacent the sense amplifier, and the end of the strap portion adjacent one of the digit line portions is coupled to such digit line portion.

20. The memory-cell array of claim 18 wherein each of the second isolation devices associated with a respective column is positioned adjacent the sense amplifier associated with the column.

21. The memory-cell array of claim 18 wherein each of the isolation devices is a transistor.

22. The memory-cell array of claim 18 wherein there are two digit line portions and one cell plate line for each column of memory cells.

23. The memory-cell array of claim 18 wherein each memory cell includes:

an access transistor having a gate terminal coupled to the associated word line, a drain terminal coupled to the data terminal, and a source terminal; and a storage capacitor having a first terminal coupled to the source terminal of the access transistor and a second terminal coupled to the reference terminal.

24. The memory-cell array of claim 18 wherein each of the digit line portions is formed from a first polysilicon layer formed on a semiconductor substrate.

25. The memory-cell array of claim 18 wherein each of the strap portions is formed from a metal layer formed on a semiconductor substrate.

26. The memory-cell array of claim 18 wherein the reference voltage is one half a supply voltage $V_{CC}$.

27. The memory-cell array of claim 18 wherein each column includes two digit line portions and one cell plate line.

28. The memory-cell array of claim 18 wherein each column includes two digit line portions and one cell plate line, and one digit line portion has a length l and a capacitance $C_{DL1}$, and the other digit line portion has a length m and a capacitance $C_{DL2}$, and each strap portion has a length n and a capacitance $C_{ST}$, the length m being less than the length l such that the capacitance $C_{DL1}$ is approximately equal to $C_{DL2}+C_{ST}$.

29. The memory-cell array of claim 18 wherein in each column of memory cells half the memory cells in the column have their data terminals coupled to a first associated digit line portion, and half the memory cells in the column have their data terminals coupled to a second associated digit line portion.

30. The memory-cell array of claim 18 wherein each sense amplifier comprises:

a first sense switch having a control terminal coupled to the second data terminal, a first signal terminal coupled to a common reference voltage level, and a second signal terminal coupled to the first data terminal;

a second sense switch having a control terminal coupled to the first data terminal, a first signal terminal coupled to the common reference voltage level, and a second signal terminal coupled to the data terminal;

a third sense switch having a control terminal coupled to the second data terminal, a first signal terminal coupled to a supply voltage Vcc, and a second signal terminal coupled to the first data terminal; and a fourth sense switch having a control terminal coupled to the first data terminal, a first signal terminal coupled to the supply voltage Vcc, and a second signal terminal coupled to the second data terminal.

31. The dynamic random access memory device of claim 30 wherein the first and second sense switches are NMOS transistors, and the third and fourth sense switches are PMOS transistors.

32. A dynamic random access memory, comprising:

an address bus;

a control bus;

a data bus;

an address decoder coupled to the address bus;

a control circuit coupled the control bus;

a read/write circuit coupled to the data bus; and a memory-cell array, including, several memory cells arranged in rows and columns, the memory cells in each row including an access terminal coupled to an associated word line, and the memory cells in each column being coupled between a respective first digit line and a respective second digit line, the second digit line being divided into several portions, a sense amplifier having first and second data terminals, the first data terminal being coupled to the first digit line, and several first isolation devices, each first isolation device selectively coupling an associated portion of the second digit line to the second data terminal of the sense amplifier.

33. The dynamic random access memory device of claim 32 wherein each memory cell comprises:

an access transistor having a gate terminal coupled to an associated word line, a drain terminal coupled to an associated first line portion, and a source terminal; and a capacitor having a first plate coupled to the source terminal, and a second plate coupled an associated second line portion.

34. A computer system, comprising:

a data input device;

a data output device; and computing circuitry coupled to the data input and output devices, the computing circuitry including a dynamic random access memory that includes, an address bus, a control bus, a data bus, an address decoder coupled to the address bus, a control circuit coupled the control bus, a read/write circuit coupled to the data bus, and a memory-cell array, including, several memory cells arranged in rows and columns, the memory cells in each row including an access terminal coupled to an associated word line, and the memory cells in each column being coupled between a respective first digit line and a respective second digit line, the second digit line being divided into several portions, a sense amplifier having first and second data terminals, the first data terminal being coupled to the first digit line, and several first isolation devices, each first isolation device selectively coupling an associated portion of the second digit line to the second data terminal of the sense amplifier.

35. The computer system of claim 34 wherein each of the memory cells in the dynamic random access memory comprises:

an access transistor having a gate terminal coupled to an associated word line, a drain terminal coupled to an associated first line portion, and a source terminal; and a capacitor having a first plate coupled to the source terminal, and a second plate coupled an associated second line portion.

36. A method of sensing data stored in a memory-cell array having a plurality of memory cells arranged in rows and columns, each memory cell in a respective column being coupled to one of several digit line portions associated with the column, and further coupled to a cell plate line associated with the column, the method comprising the steps of activating a row of memory cells in the memory-cell array to thereby transfer the data stored in each activated memory cell to the associated digit line portion, and sensing the data stored in each activated memory cell by sensing a voltage differential between the digit line portion coupled to the activated memory cell and the associated cell plate line.

37. A method of sensing data stored in a memory-cell array having a plurality of memory cells arranged in rows and columns, each memory cell in a respective column coupled to one of several digit line portions associated with the column, and each memory cell in a column further coupled to a cell plate line associated with the column, the memory-cell array further including a number of sense amplifiers, one sense amplifier associated with each column and each sense amplifier including first and second data terminals and operable to drive the data terminals to voltages corresponding to complementary logic levels in response to a voltage differential on the data terminals, the method comprising the steps of:

activating a row of memory cells in the memory-cell array;

transferring the data stored in each activated memory cell onto the respective digit line portion coupled to the activated cell;

coupling each cell plate line to the first data terminal of the associated sense amplifier;

coupling the digit line portion in each column that is coupled to the activated memory cell to the second data terminal of the associated sense amplifier;

isolating each cell plate line from the first data terminal of the associated sense amplifier;

isolating the digit line portion in each column that is coupled to the activated memory cell from the second data terminal of the associated sense amplifier; and coupling the digit lines coupled to the activated memory cells for a second time to the second data terminal of the respective sense amplifiers to thereby restore the sensed data in the activated memory cells.

38. The method of claim 37 wherein there is a predetermined time between the steps of coupling each cell plate line to the first data terminal of the associated sense amplifier and isolating each cell plate line from the first data terminal of the associated sense amplifier.

39. The method of claim 37 wherein there is a predetermined time between the steps of coupling the digit line portion in each column that is coupled to the activated memory cell to the second data terminal of the associated sense amplifier and isolating the digit line portion in each column that is coupled to the activated memory cell from the second data terminal of the associated sense amplifier.

40. The method of claim 37 wherein the steps of coupling each cell plate line to the first data terminal of the associated sense amplifier and coupling the digit line portion in each column that is coupled to the activated memory cell to the second data terminal of the associated sense amplifier occur at approximately the same time.

41. A method for developing an increased voltage change on digit lines in a memory-cell array in response to the activation of memory cells coupled to the digit lines, the memory-cell array having a plurality of memory cells arranged in rows and columns, the method comprising the steps of coupling a reference terminal of each memory cell in a respective column to one of several cell plate lines associated with the column, each cell plate line having a capacitance that is less than the capacitance of a cell plate line coupled to all memory cells in the column, and coupling each memory cell in a respective column, when activated, to one of several digit line portions associated with the column, each digit line portion having a capacitance which is less than a capacitance of a digit line coupled to all memory cells in a respective column.

* * * * *